United States Patent [19]
Kondo

[11] Patent Number: 5,324,688
[45] Date of Patent: Jun. 28, 1994

[54] METHOD OF FABRICATING A SEMICONDUCTOR ACCELERATION SENSOR

[75] Inventor: Yuji Kondo, Tokyo, Japan

[73] Assignee: NEC Corporation, Tokyo, Japan

[21] Appl. No.: 808,225

[22] Filed: Dec. 16, 1991

[30] Foreign Application Priority Data

Dec. 17, 1990 [JP] Japan .................................. 2-402626

[51] Int. Cl.$^5$ .......................................... H01L 21/308
[52] U.S. Cl. .................................. 437/228; 437/901; 437/921
[58] Field of Search ........... 148/DIG. 135, DIG. 159; 437/228, 901, 974, 921; 257/419

[56] References Cited

FOREIGN PATENT DOCUMENTS

| 63-76483 | 4/1988 | Japan . |
| 1224671 | 9/1989 | Japan . |
| 1229976 | 9/1989 | Japan . |
| 2156683 | 6/1990 | Japan . |
| 2218172 | 8/1990 | Japan . |
| 3200373 | 9/1991 | Japan . |

Primary Examiner—George Fourson
Attorney, Agent, or Firm—Burns, Doane, Swecker & Mathis

[57] ABSTRACT

A P-type impurity is diffused into an N-type epitaxial layer formed on a P-type silicon substrate. A gauge resistor for measuring deformation is formed on this epitaxial layer, with an aluminum wiring provided between the gauge resistor and a pad. Then, bottom-surface etching is performed on the resultant structure to remove a groove portion, thus forming a cantilever, weight portion and rim portion. The groove portion between the weight portion and rim portion is formed to penetrate through the P-type diffusion layer and become narrower toward the top surface from the bottom surface, thus preventing dust or the like from entering the groove portion. The etching from the bottom can reduce the number of required etching steps, ensuring lower fabrication cost.

3 Claims, 4 Drawing Sheets

METHOD OF FABRICATING A SEMICONDUCTOR ACCELERATION SENSOR

BACKGROUND OF THE INVENTION

1. Field of the Invention

The present invention relates to a semiconductor acceleration sensor and a method of fabricating the same. More particularly, this invention is directed to a semiconductor acceleration sensor which has its silicon substrate subjected to three-dimensional processing to fabricate the formation of a weight portion or the like, and a method of fabricating the same.

2. Description of the Related Art

Conventionally, a semiconductor acceleration sensor of this type employs a wafer having an epitaxial layer formed on a silicon substrate, and has a weight portion and a cantilever formed by etching both surfaces of the wafer. In the method of fabricating the semiconductor acceleration sensor, first the bottom surface of the epitaxial layer is etched to the depth of the epitaxial layer to form half of a groove and the cantilever. Then the resultant structure is etched from the top surface only to form a groove region to permit penetration thereto, thus providing a weight portion.

FIG. 1 presents cross-sectional views exemplifying a step-by-step fabrication of a conventional semiconductor acceleration sensor. As shown in FIG. 1A, a conventional semiconductor diffusion process is performed on an epitaxial layer 2 epitaxially grown on a P-type silicon substrate 1. A gauge resistor 3 which detects acceleration, a pad 8 to be provided in a rim region 6A, and an aluminum wiring 11 which connects the gauge resistor 3 and the pad 8 are formed in a cantilever region 4A. Reference numeral "9" shows an oxide film and "7A" is a groove region. After an oxide film 13 is formed on the bottom surface of the P-type silicon substrate 1, etching is performed by an anodizing process to form an oxide film on a cantilever 4 and a groove portion 7, as shown in FIG. 1B. Since the silicon substrate 1 and the epitaxial layer 2 differ in a conductive type, the etching naturally stops at the bottom surface of the epitaxial layer 2. Further, as shown in FIG. 1C, etching restarts from the top surface of the N-type epitaxial layer 2 to complete a weight portion 5, a rim portion 6 around the weight portion 5, and the groove portion 7, thus providing a semiconductor acceleration sensor.

The above-described conventional semiconductor acceleration sensor involves problems in the structure of its weight portion or groove portion, so that dust or the like can easily enter that portion, deteriorating the sensitivity characteristics.

Further, according to the above conventional fabrication method, the overall process becomes complicated due to the following steps required in the etching process of the weight portion, groove portion or cantilever:

(1) Exposing and developing procedures have to be conducted twice in association with the bottom-surface and top-surface etching procedures.

(2) A jig and tools used in the top-surface etching procedure should be replaced when the bottom-surface etching is performed.

(3) The bottom surface of the silicon substrate should be covered with a protective film such as silicon oxide when the top-surface etching is performed after the bottom-surface etching.

The complicated process is likely to cause dust to enter the weight portion or groove portion during etching, resulting in accidents or yielding defects, and will increase the fabrication cost by the increased number of steps.

SUMMARY OF THE INVENTION

It is therefore a first object of the present invention to provide a semiconductor acceleration sensor which prevents dust or the like from entering a groove portion, and has improved sensitivity characteristics.

It is a second object of the present invention to provide a method of fabricating a semiconductor acceleration sensor which has a reduced number of etching and exposing steps, simplifying the fabricating process.

It is a third object of the present invention to provide a method of fabricating a semiconductor acceleration sensor which can avoid accidents during an etching process, and has an inexpensive fabrication cost.

The semiconductor acceleration sensor according to the first aspect of the present invention comprises a silicon substrate of one conductivity type; an epitaxial layer of the opposite conductivity type formed on the substrate; a diffusion layer of the one conductivity type diffused in the epitaxial layer; a gauge resistor formed on the epitaxial layer; a thin film cantilever formed by etching a bottom surface of that portion of resultant structure which corresponds to the gauge resistor; a square rim portion having a top surface provided with a pad connected to the gauge resistor, and coupled to the cantilever; and a weight portion isolated from the rim portion by a groove portion which becomes wider toward a bottom surface from the top surface by the bottom-surface etching, and coupled to the rim portion only through the cantilever.

Meanwhile, the method of fabricating a semiconductor acceleration sensor according to the second aspect of the present invention comprises the steps of forming an epitaxial layer on a silicon substrate of one conductivity type, the epitaxial layer having the opposite conductivity type; diffusing impurities of the one conductivity type into the epitaxial layer deeper than the depth of the epitaxial layer to form a diffusion layer of the one conductivity type; forming a gauge resistor on the epitaxial layer and wiring the gauge resistor to a pad; and etching the silicon substrate from a bottom surface thereof to remove the silicon substrate to the depth of a top surface thereof at that portion where the diffusion layer is present to thereby form a groove portion, the etching automatically stopping at the epitaxial layer at that portion where the gauge resistor is present to thereby form an anodized film to provide a cantilever.

Further, the method of fabricating a semiconductor acceleration sensor according to the third aspect of the present invention comprises the steps of forming an epitaxial layer on a silicon substrate of one conductivity type, the epitaxial layer having the opposite conductivity type; diffusing impurities of the one conductivity type into the epitaxial layer deeper than the depth of the epitaxial layer to form a diffusion layer of the one conductivity type and making a bottom surface of the diffusion layer smaller than a groove region; forming a gauge resistor on the epitaxial layer and wiring the gauge resistor to a pad; and etching the silicon substrate from a bottom surface thereof to remove the silicon substrate to the depth of a top surface thereof at a center of that portion where the diffusion layer is present and automatically stopping the etching at the epitaxial layer at a peripheral portion to form an anodized film, thereby forming a groove portion having a step, the etching automatically stopping at that portion where the gauge resistor is present to thereby form an anodized film to provide a cantilever.

DETAILED DESCRIPTION OF THE PREFERRED EMBODIMENTS

Preferred embodiments of the present invention will now be described referring to the accompanying drawings.

Figure 2:
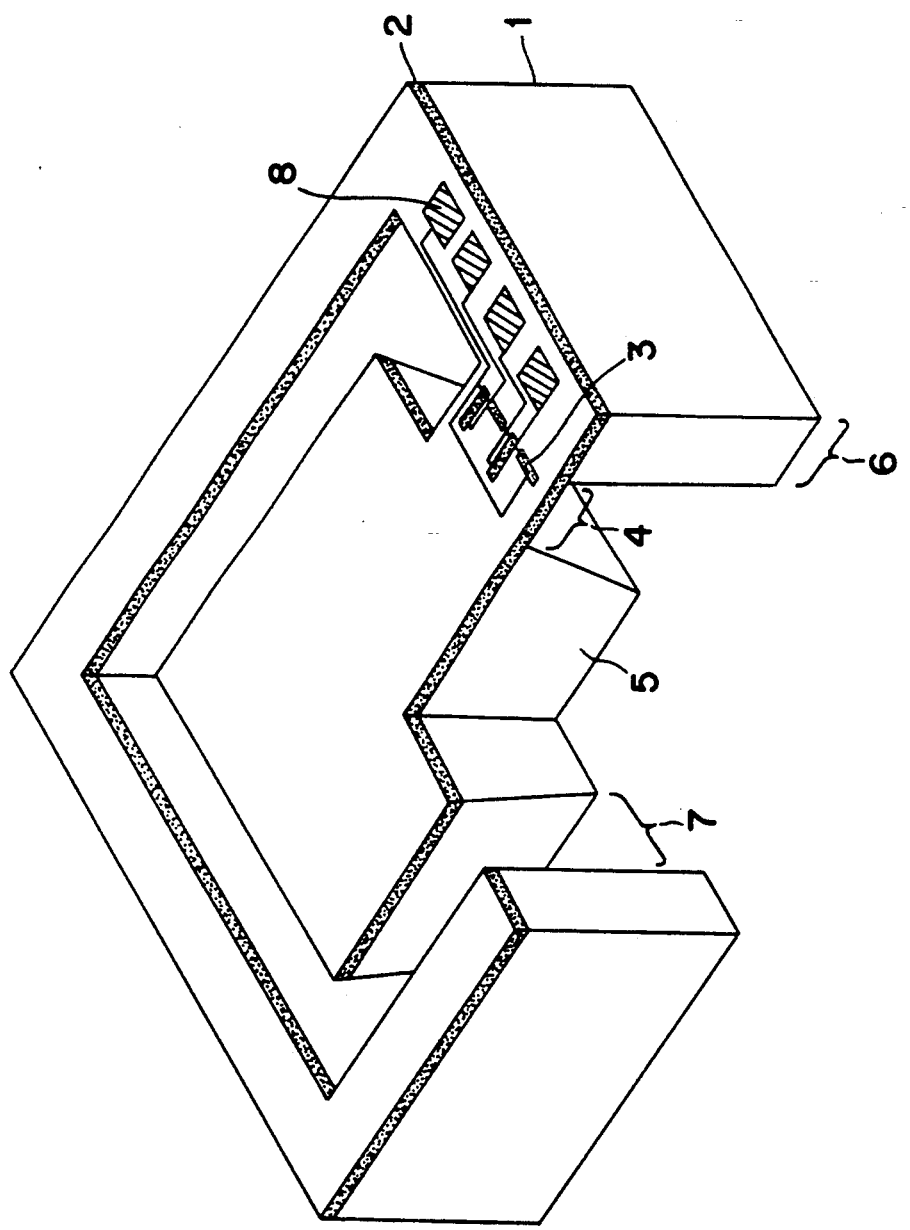
FIG. 2 is a partially cutaway perspective view illustrating a semiconductor acceleration sensor according to one embodiment of the present invention.
Figure 3A:
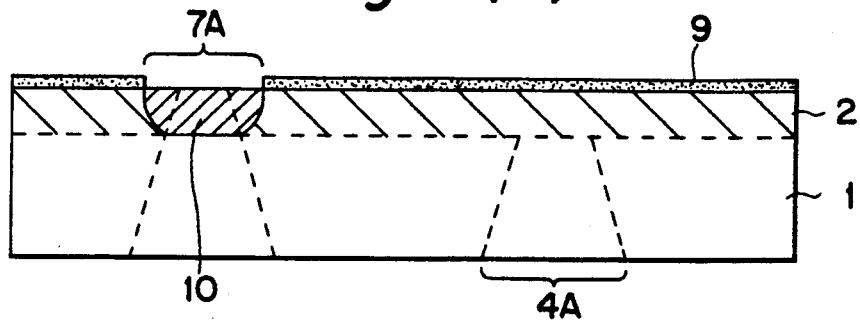
FIGS. 3(a)–3(d) present cross-sectional views shown by each step for explaining a method of fabricating a semiconductor acceleration sensor according to one embodiment of the present invention.
Figure 3B:
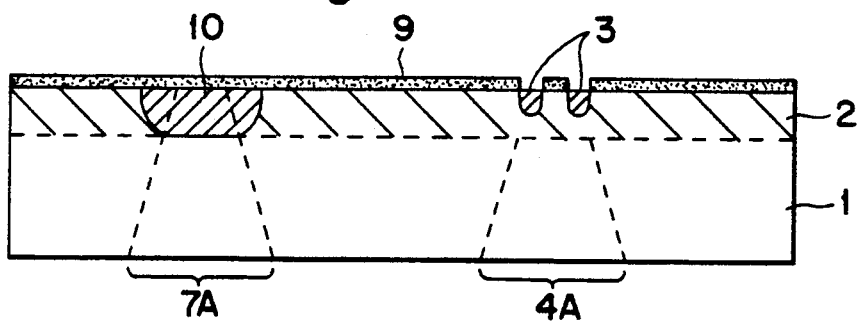
Figure 3C:
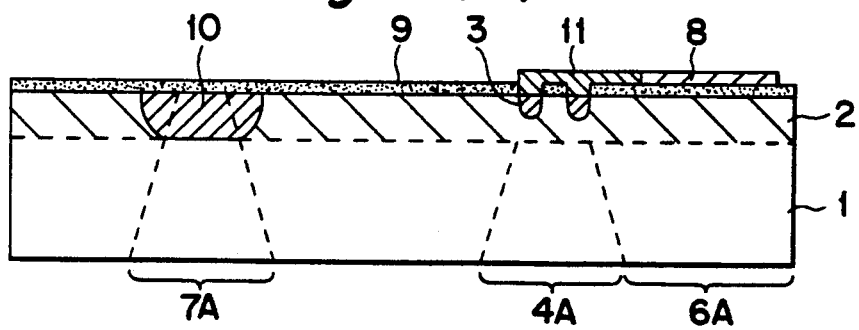
Figure 3D:
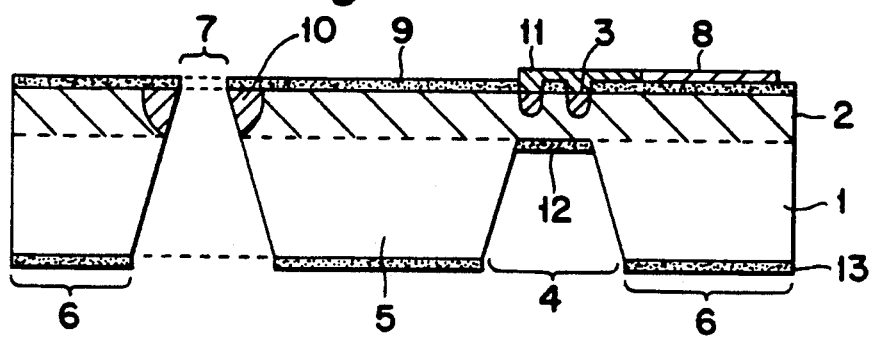

FIG. 2 is a partially cutaway perspective view illustrating a semiconductor acceleration sensor according to one embodiment of the present invention. As shown in FIG. 2, the semiconductor acceleration sensor of the present invention comprises a P-type silicon substrate 1, an N-type epitaxial layer 2 formed on the substrate 1, a P-type diffusion layer (not shown) diffused in the epitaxial layer 2, a gauge resistor 3 formed on the epitaxial layer 2, a thin film cantilever 4 formed by etching at the bottom surface of the substrate at the position of the gauge resistor 3, a rim portion 6 having a pad 8 formed on its top surface, which is connected to the gauge resistor, and a weight portion 5 isolated from the rim portion 6 by a groove portion 7 which is formed to become wider toward the bottom surface from the top surface by the bottom-surface etching. The rim portion 6 is formed to be a square shape around the weight portion 5 and coupled to the weight portion 5 only via the cantilever 4. In this embodiment, an N/P-type silicon wafer formed on the P-type silicon substrate 1 is used for the N-type epitaxial layer 2, and the gauge resistor 3 is diffused in the N-type epitaxial layer 2 below which the cantilever 4 lies. The cantilever is the only portion which connects the weight portion 5 or the center portion of the semiconductor acceleration sensor to the rim portion 6 or the peripheral portion of the sensor. In the other portion than the cantilever 4, i.e., the groove portion 7, neither the epitaxial layer 2 nor the P-type silicon substrate 1 is present, thus separating the weight portion 5 from the rim portion 6.

When acceleration or vibration is applied to this semiconductor acceleration sensor, the weight portion 5 would be deformed in the direction of the acceleration. The strain caused by that deformation of the weight portion 5 affords a piezoelectric resistant effect in the gauge resistor 3 above the cantilever 4, changing the resistance of the gauge resistor 3. The acceleration or vibration is detected as an electric signal by detecting this change in resistance through the pad 8. Since the groove portion 7 defined between the weight portion 5 and the rim portion 6 is formed wider toward the bottom surface from the top surface, it is possible to prevent dust or the like from entering the sensor, thus enhancing the sensitivity of the sensor.

Figure 1A:
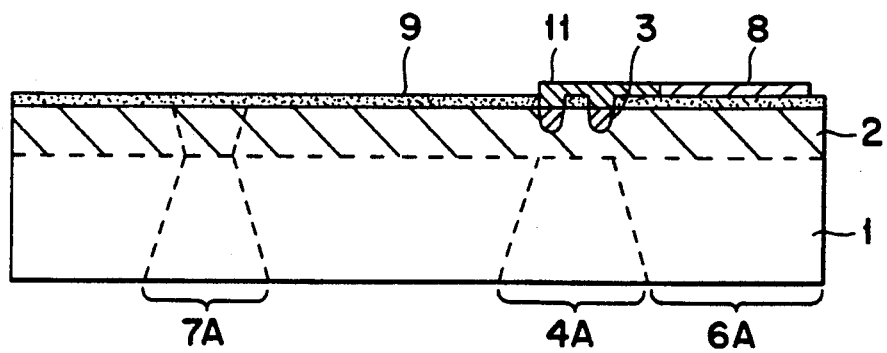
FIGS. 1(a), 1(b) and 1(c) present cross-sectional views shown by each step exemplifying a conventional semiconductor acceleration sensor and a method of fabricating the same.
Figure 1B:
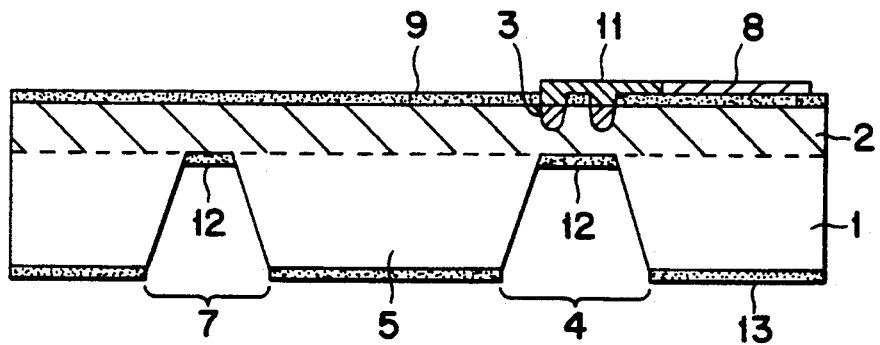
Figure 1C:
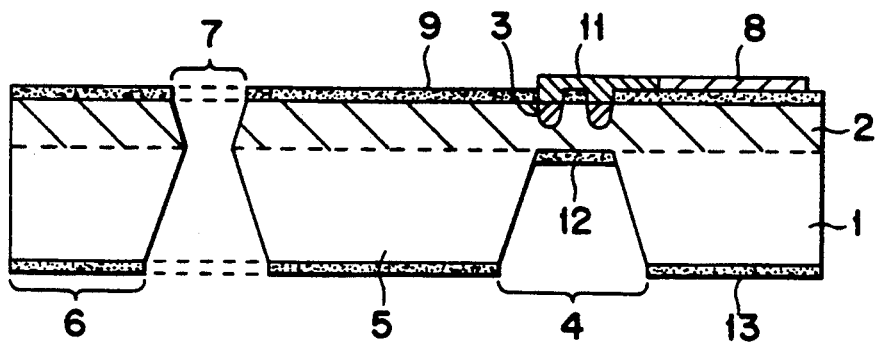

FIG. 3 presents cross-sectional views of an acceleration sensor in FIG. 1 shown by each step for explaining a method of fabricating the same according to one embodiment of the present invention. As shown in FIG. 3A, after the N-type epitaxial layer 2 and an oxide film 9 are formed on the P-type silicon substrate 1, the oxide film 9 on a groove region 7A is removed, followed by diffusing a P-type impurity such as boron to form a P-type diffusion layer 10. The groove region 7A serves as a groove to separate the weight portion 5 from the rim portion 6. The impurity is to be diffused as deep as the depth of the N-type epitaxial layer 2 or deeper, so that the impurity reaches the P-type silicon substrate 1. Further, the impurity is to be diffused wider than the width of the groove portion 7 which is formed by etching. As shown in FIG. 3B, the oxide film 9 on a cantilever region 4A is removed and impurity diffusion or ion-injection is performed on the epitaxial layer 2 to form the gauge resistor 3. Further, the pad 8 is adhered on the oxide film 9 in a rim region 6A and is connected to the gauge resistor 3 by an aluminum wiring 11, as shown in FIG. 3C. The resultant structure is therefore connectable to the outside through the pad 8. At this time the P-type diffusion layer 10 is covered with the oxide film 9. As shown in FIG. 3D, the cantilever region 4A and the groove region 7A are removed from an oxide film 13 formed on the bottom surface of the P-type silicon substrate 1, and bottom-surface etching is performed on the resultant structure, thus yielding the cantilever 4, the weight portion 5, the rim portion 6 and the groove portion 7. The etching method to be used is an anodizing method (ANOX method), which will be described more specifically below. According to the anodizing method, a voltage is applied between the P-type silicon substrate 1 and the N-type epitaxial layer 2 in the reverse bias direction, and an electrochemical etching is performed in this condition. When the P-type silicon substrate 1 is etched and that part of the N-type epitaxial layer 2 which becomes the cantilever 4 is exposed to an etchant, a current flows from the N-type epitaxial layer 2 constituting the cantilever 4 to the etchant. This is because a PN junction between the P-type silicon substrate 1 and the N-type epitaxial layer 2 is etched out, thus facilitating the current flow. The current causes an oxidization reaction in the surface layer portion of the N-type epitaxial layer 2 which has been exposed to the etchant, thus forming an anodized film 12 on the surface. Consequently, etching to the N-type epitaxial layer 2 will stop. Since a P-type impurity such as boron has been diffused in the other portion than what becomes the cantilever 4 or the groove portion 7, there is no PN junction which is a condition for causing anodization. Etching of the groove portion 7 will not therefore stop and will proceed until it penetrates the substrate to reach the wafer surface. In other words, etching of the portion which becomes the cantilever 4 will automatically stop due to the anodization, while etching of the portion which becomes the groove portion 7 will proceed to separate the weight portion 5 from the rim portion 6, thus providing the acceleration sensor in the final form.

Figure 4A:
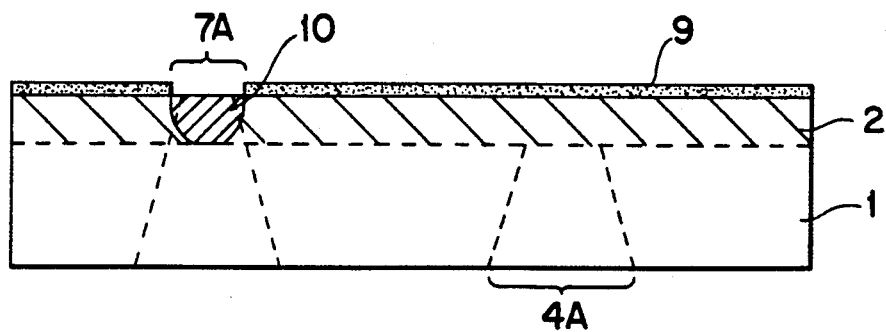
FIGS. 4(a)–4(c) present cross-sectional views shown by each step for explaining a semiconductor acceleration sensor and a method of fabricating the same according to another embodiment of the present invention.

FIG. 4 presents cross-sectional views for explaining a semiconductor acceleration sensor by each step and a method of fabricating the same according to another embodiment of the present invention. The impurity diffusion region is made relatively narrow according to this embodiment, as shown in FIG. 4A, whereas, according to the previous embodiment, the top portion of the groove portion 7 is made relatively wide and the P-type impurity diffusion layer 10 is made wider than the groove portion 7 which is formed by the bottom-surface etching. The design of this embodiment makes the top portion of the formed groove portion 7 considerably narrower than that of the previous embodiment, making it difficult for dust or the like to enter that portion.

Figure 4B:
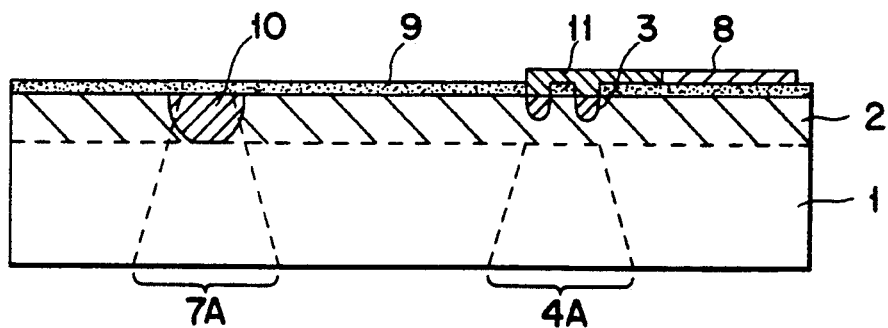
Figure 4C:
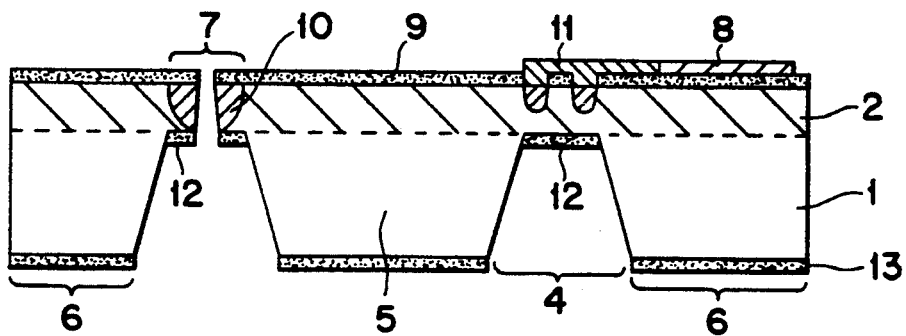

According to the method of fabricating the semiconductor acceleration sensor, as shown in FIG. 4A, a P-type impurity, such as boron, is diffused in the groove region 7A. The impurities may be diffused as deep as the depth of the N-type epitaxial layer 2, or deeper so as to reach the P-type silicon substrate 1. The width of the diffusion region is however to be made narrower than that formed in the previous embodiment. Then, as shown in FIG. 4B, the gauge resistor 3, pad 8 and aluminum wiring 11 are formed as per the previous embodiment. Further, as shown in FIG. 4C, the cantilever region 4A and the groove region 7A are etched to form the cantilever 4 and groove portion 7 as well as the weight portion 5 and rim portion 6. The etching is done using an anodizing method, as in the previous embodiment. According to the anodizing method, when etching of the P-type silicon substrate 1 proceeds and the N-type epitaxial layer 2 is exposed to an etchant, forming the anodized film 12 on that portion. As the anodized film 12 is formed on the entire surface of the cantilever 4, etching will automatically stop. With regard to the groove portion 7, the anodized film 12 is formed only on that portion where the N-type epitaxial layer 2 is exposed, and etching will not automatically stop in that portion in the P-type diffusion layer 10 where the P-type impurity has been diffused. Consequently, the groove portion 7 narrower than the opening formed in the oxide film 13 at the bottom will be formed on the top surface of the resultant structure.

Although two embodiments of a semiconductor acceleration sensor and a method of fabricating the same have been described, the present invention may be realized even if the conductivity types, i.e. P-type and N-type are reversed.

As described above, in the semiconductor acceleration sensor according to the first aspect of the present invention, impurities of the same conductivity type as that of the silicon substrate are diffused in the epitaxial layer on the substrate, and that portion is etched from the bottom to form a groove portion which becomes narrower toward the top surface, thus preventing dust or the like from entering the groove portion and improving the sensitivity.

The method of fabricating the semiconductor acceleration sensor according to the second aspect of the present invention needs a single etching process from the bottom to form a cantilever, multibeam or the like, thus reducing the number of etching steps and exposure steps and lowering the fabrication cost.

According to the method of fabricating the semiconductor acceleration sensor according to the third aspect of the present invention, the groove portion of the epitaxial layer can be made narrower and the opening in the oxide film at the bottom of the silicon substrate can be made wider by adjusting the width of the impurity diffusion layer to be formed on the epitaxial layer. This design can improve the etching speed and reduce the possibility of dust or the like from entering the groove portion during etching to affect the etching.

What is claimed is:

1. A method of fabricating a semiconductor acceleration sensor comprising the steps of:

forming an epitaxial layer on a silicon substrate of one conductivity type, the epitaxial layer having the opposite conductivity type;

diffusing impurities of the one conductivity type into a portion of the epitaxial layer deeper than the depth of the epitaxial layer to form a diffusion layer of the one conductivity type;

forming a gauge resistor on the epitaxial layer and wiring the gauge resistor to a pad; and etching the silicon substrate from a bottom surface thereof to remove the silicon substrate to the depth of a top surface thereof at said portion where the diffusion layer is present and through a resulting exposed portion of the diffusion layer to thereby form a groove portion, the etching automatically stopping at the epitaxial layer at that portion where the gauge resistor is present to provide a cantilever.

2. A method according to claim 1, wherein the diffusion layer of the one conductivity type has a bottom surface larger than the groove portion.

3. A method of fabricating a semiconductor acceleration sensor comprising the steps of:

forming an epitaxial layer on a silicon substrate of one conductivity type, the epitaxial layer having the opposite conductivity type;

diffusing impurities of the one conductivity type into a portion of the epitaxial layer deeper than the depth of the epitaxial layer to form a diffusion layer of the one conductivity type and making a bottom surface of the diffusion layer smaller than a groove region;

forming a gauge resistor on the epitaxial layer and wiring the gauge resistor to a pad; and etching the silicon substrate from a bottom surface thereof to remove the silicon substrate to the depth of a top surface thereof at a center of that portion where the diffusion layer is present and through a resulting exposed portion of the diffusion layer and automatically stopping etching at the epitaxial layer at a peripheral portion, thereby forming a groove portion having a step, the etching automatically stopping at that portion where the gauge resistor is present to provide a cantilever.

* * * * *